United States Patent
Diewald

(10) Patent No.: US 7,884,651 B2
(45) Date of Patent: Feb. 8, 2011

(54) COMPARATOR

(75) Inventor: Horst Diewald, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/398,045

(22) Filed: Mar. 4, 2009

(65) Prior Publication Data

US 2009/0289665 A1 Nov. 26, 2009

Related U.S. Application Data

(60) Provisional application No. 61/141,807, filed on Dec. 31, 2008.

(51) Int. Cl.
*H03K 5/22* (2006.01)

(52) U.S. Cl. ........................................... 327/76

(58) Field of Classification Search .............. 327/74–76
See application file for complete search history.

(56) References Cited

U.S. PATENT DOCUMENTS

| | | | | |
|---|---|---|---|---|
| 4,558,303 A | * | 12/1985 | Fielden | 341/158 |
| 4,588,905 A | * | 5/1986 | Kojima | 327/166 |
| 5,623,220 A | * | 4/1997 | Betti et al. | 327/79 |
| 6,111,437 A | * | 8/2000 | Patel | 327/74 |
| 6,597,224 B2 | * | 7/2003 | Lin et al. | 327/205 |
| 6,628,147 B2 | * | 9/2003 | Dathe et al. | 327/74 |
| 6,906,568 B2 | * | 6/2005 | Lin et al. | 327/205 |
| 2005/0057282 A1 | * | 3/2005 | Tsuchida et al. | 327/74 |

FOREIGN PATENT DOCUMENTS

DE    10 2006 026 666    12/2007

* cited by examiner

*Primary Examiner*—Lincoln Donovan
*Assistant Examiner*—William Hernandez
(74) *Attorney, Agent, or Firm*—Robert D. Marshall, Jr.; W. James Brady; Frederick J. Telecky, Jr.

(57) ABSTRACT

An electronic device compares a first voltage with a selected first reference voltage or second reference voltage. The electronic device includes a comparator having a first input receiving the first voltage, a second input receiving the selected reference voltage and an output providing an output signal based on a comparison. A control stage connected to the output of the comparator generates a control signal based on the output of the comparator. The electronic device selects either the first reference voltage or the second reference voltage in response to the control signal thus comparing the first voltage with the selected reference voltage.

8 Claims, 14 Drawing Sheets

COMPARATOR

CLAIM OF PRIORITY

This application claims priority 35 U.S.C. 119(a) to German Patent Application No. 10 2008 012 381.1 filed Mar. 4, 2008 and under and 35 U.S.C. 119(e)(1) to U.S. Provisional Application No. 61/141,807 filed Dec. 31, 2008.

TECHNICAL FIELD OF THE INVENTION

The technical field of this invention is an electronic device and method for comparing a first voltage with multiple reference voltages.

BACKGROUND OF THE INVENTION

Today's ultra-low power integrated circuits are able to operate with currents of less than 1 micro Ampere ($\mu A$). In order to achieve the required stable supply voltages, the supply voltage is compared with a reference voltage. Such an integrated circuit usually has several voltage domains. Each voltage domain has its individual supply voltage. Each supply voltage must be compared with several pre-selected reference voltages. An individual comparator per each voltage is used to determine whether or not supply voltages are above or below pre-selected reference voltages. Each comparator can only consume a fraction of the 1 $\mu A$ current used for the whole electronic device. The remainder of the power must be preserved for several other components of the electronic device. Therefore, it is desirable to compare supply voltages of different voltage domains with multiple pre-selected reference voltages while consuming only a small amount of power.

SUMMARY OF THE INVENTION

One aspect of the present invention compares a first voltage with multiple reference voltages with low current consumption without requiring complex circuitry and cheaply implemented.

The present invention is an electronic device for comparing a first voltage with first and second reference voltages. The electronic device comprises a comparator having a first input receiving the first voltage, a second input receiving a selected reference voltage, and an output providing an output signal based on a comparison. The electronic device further comprises a control stage connected to the output of the comparator. The control stage provides a control signal based on the output signal from the comparator. The electronic device selects either a first reference voltage or a second reference voltage in response to the control signal and compares the first voltage with the selected reference voltage. The control stage applies either the first or the second reference voltage to the comparator to compare the first voltage. The present invention provides feedback to the comparator such that another (higher or lower, first or second) reference voltage from the multiple reference voltages is selected dependent on the result of the comparison between the first voltage and the previously selected reference voltage. The electronic device may have a multiplexer switching the reference voltage or an input path of the comparator associated with a higher or lower reference voltage may be selectively switched. The first voltage to be compared may advantageously be a voltage indicative of the supply voltage of a voltage domain or the supply voltage itself. The first voltage can be derived from the supply voltage. The first voltage is a signal which represents a supply voltage or which is indicative of supply voltage. This can be advantageous as the input range of the comparator can be limited and may not be large enough to handle input voltages as high (or low) as the supply voltages. The result of the comparison is an indicator for the voltage of the supply voltage. Furthermore, instead of monitoring a supply voltage another voltage may be monitored and respective reference voltages may be used.

The comparator selects one of multiple reference voltages as the reference voltage in response to the control signal to compare the first voltage with each selected reference voltage. The control signal can be a single signal line or multiple lines. A control input in the comparator selects one of the multiple reference voltages in response to a control signal from the control stage and compares the selected reference voltage with the first voltage. The comparator then outputs a signal of the result of the comparison. The reference voltage is selected according to the situation in which the device operates. For example, the lowest reference voltage can be selected after reset. If the first voltage is higher than the lowest reference, the next lowest reference voltage is selected, and so on. Thus one comparator with multiple input paths, each of which can be selectively switched on and off, can have low current consumption and little circuit complexity. With the comparator and control stage of the present invention, it is possible to use a single comparator to compare the first voltage with multiple reference voltages. In an alternative embodiment, a multiplexer switches between different reference voltages. The control stage then controls the multiplexer. Using a single comparator instead of multiple comparators saves power and circuit complexity. The electronic device according to the present invention can preferably be used to monitor a supply voltage with respect to two or more supply voltage windows in an integrated circuit. Integrated circuits often use two or more different supply voltage domains, for example for digital and analog circuitry. If the supply voltage is high enough to supply the digital circuitry, the respective parts of the integrated circuit may be switched on, when the respective supply voltage is reached. However, the analog circuits may need a higher supply voltage. Therefore, these parts are switched on later, only when the supply voltage is high enough to supply the analog components. The electronic device according to the present invention can monitor several supply voltage domains with a single comparator.

According to an advantageous aspect of the present invention, the control stage provides a wait state after switching the selected reference voltage between the first and second reference voltages. The wait state corresponds to the comparator's settling time. The output signal from the comparator (OUT) is then only used after this wait state when it has settled. Furthermore, the control stage performs transitions from the first reference voltage to the second reference voltage in response to a clock signal. The clock may be enabled in response to a comparison result only if the comparison indicates that a supply voltage high enough to supply the digital part of a circuit. The clock signal is then used as a time reference for switching. This aspect of the invention prevents uncontrolled fast changes between reference voltages in situations where the supply voltage rises and falls rapidly such as during battery exchange.

The control stage can select the reference voltages to provide a hysteresis with respect to the first voltage. A hysteresis can advantageously prevent unwanted and premature switching. In the case of a monitored supply voltage, the first voltage is derived from the supply voltage and compared to a relatively higher first reference voltage. If the first voltage is higher than the first reference voltage, the comparator is switched to use a second reference voltage, which is lower than the first reference voltage. The comparator switches back to the first reference voltage only if the first voltage drops below the second reference voltage. This principle can be applied to several reference voltages.

The electronic device of the present invention can advantageously adapted to select a second voltage to be compared with the selected reference voltage instead of only the first voltage. Accordingly, the selected one of the multiple voltages can compared with the selected reference. The same mechanism as for the reference voltages can be applied to multiple voltages to be monitored or controlled. The switching can be performed in response to a comparator output signal, but may also be based on a fixed timing so as to monitor and/or control several voltages periodically.

According to important aspects of the present invention, the comparator provides the required functionality in a very efficient manner. For example, the first input stage used to input the reference voltage and/or the second input stage used to input the first voltage can have an individual input path for each of the multiple reference and/or first voltages. Each input path of an input stage can then be configured to be switched on and off individually for comparing the selected reference voltage with the selected first voltage. In an advantageous implementation, each input path can be configured to remain in a preloaded state when switched off. This is done by controlling a transistor in each input path with a complementary control signal to the one used to switch the path. If an input path is preloaded, charging the respective nodes in the input path is not necessary when switching between different reference and supply voltages. This improves speed and settling behavior substantially. Preferably, the comparator has a trimming input for adjusting slew rate, settling behavior and power consumption. This saves power if only slow settling and switching is required.

In one embodiment of the invention, the first and second input stages can each be implemented as either a digital multiplexer or an analog multiplexer connected to the respective positive and negative inputs of the comparator. In this case the comparator can be a single stage input comparator, with the multiplexers having multiple inputs for receiving multiple reference voltages and possibly also multiple signals representing multiple supply voltages to be monitored. In this case, the control stage provides the control signal directly to the multiplexer forming the second input stage for switching between the multiple reference voltages.

The present invention is also a comparator for comparing a first voltage with multiple reference voltages. The comparator has a first input stage for receiving the first voltage, a second input stage for receiving the reference voltage and an output for providing an output signal based on the comparison. At least the second input stage has an individual input path for each of the multiple reference voltages in order to compare the first voltage with multiple different reference voltages. Each input path can be switched selectively and individually. According to another aspect of the invention, the first input stage also has multiple input paths, each of which can selectively be switched on and off. The first voltage is preferably a voltage derived from a supply voltage. The comparator is advantageously used for monitoring multiple supply voltages of multiple different voltage domains of an electronic device.

Other aspects of the comparator ensue from the description of the electronic device according to the present invention and from the description herein below of the preferred embodiments of the present invention.

The present invention also provides a method of comparing a first voltage with a first and a second reference voltage. The first reference voltage is selected and a first voltage is compared with the first reference voltage. A second reference voltage is selected in response to the comparison result and the first voltage is compared with the second reference voltage. Other aspects of the method according to the present invention transpire from the explanations herein above and herein below.

The present invention can be applied even to a complex variation in the supply voltage. If the supply voltage should become greater than the selected reference voltage, the input path associated with the selected reference voltage can be switched off and the input path associated with the next highest reference voltage can be switched on. If the supply voltage becomes lower than the selected reference voltage, the input path associated with the selected voltage can be switched off and the input path associated with the next lowest reference voltage switched on. Switching between input paths can be implemented by a latching mechanism.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
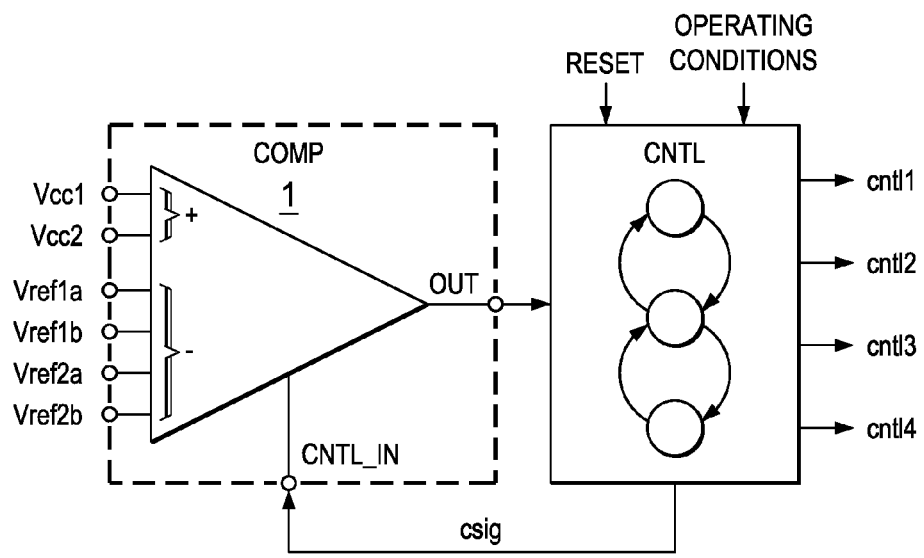
FIG. 1 is a simplified schematic of an electronic device including a comparator and a state machine according to the present invention.

FIG. 1 shows an electronic device according to a first embodiment of the present invention. Device 1 includes a comparator COMP with a possible chip boundary shown by a dotted line. Comparator COMP has a positive input and a negative input. The positive input receives a first voltage and the negative input stage receives a reference voltage. As shown in FIG. 1, the positive input has two input paths for receiving two supply voltages Vcc1 and Vcc2 and the negative input has four input paths for receiving four corresponding reference voltages Vref1a, Vref1b, Vref2a and Vref2b. In the context of the present invention, the supply voltages Vcc1 and Vcc2 may be voltages derived using voltage dividers from the actual supply voltages rather than the actual supply voltages Vcc1 and Vcc2. Furthermore, the present invention can advantageously be applied to any voltages to be monitored. Comparator COMP has a control input CNTL_IN receiving a control signal csig that is generated by a control stage CONTROL in response to the comparator's output signal. Output terminal OUT of comparator COMP is connected to an input of control stage CONTROL. Control stage CONTROL also has a reset input Reset and an output connected to control input CNTL_IN of comparator COMP. Control stage CONTROL can be a state machine receiving further operating conditions such as instructions or feedback signals providing the necessary control signals for switching the inputs of comparator COMP.

Figure 2:
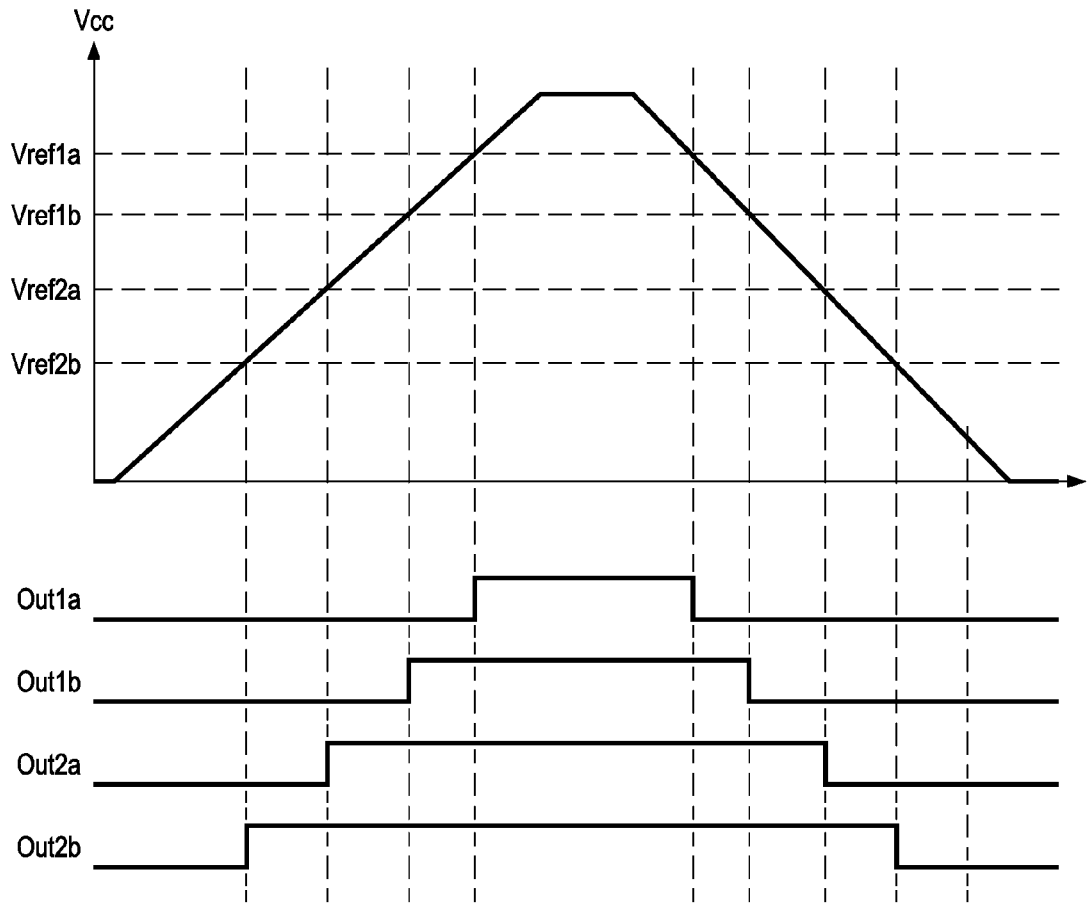
FIG. 2 is a graph of constantly increasing and decreasing supply voltage as a function of time showing reference voltages and output states of a comparator according to the present invention.

The present invention is useful in observing voltage conditions such as the ramp up and ramp down of the supply voltage Vcc shown in the upper part of FIG. 2. FIG. 2 is a graph of the supply voltage Vcc as a function of time. FIG. 2 also shows multiple reference voltages Vref1a, Vref1b, Vref2a and Vref2b and the states of output signals Out1a, Out1b, Out2a and Out2b. Either logic 0 or 1 is output from comparator COMP at its output OUT. The single bit output of Comparator COMP is associated with respective reference voltages Vref1a, Vref1b, Vref2a and Vref2b. The output signal logic 1 or 0 corresponding to Out1a, Out1b, Out2a and Out2b from output OUT is fed to control stage CONTROL for switching between its logic states because control stage CONTROL is aware of the chosen reference.

Figure 3:
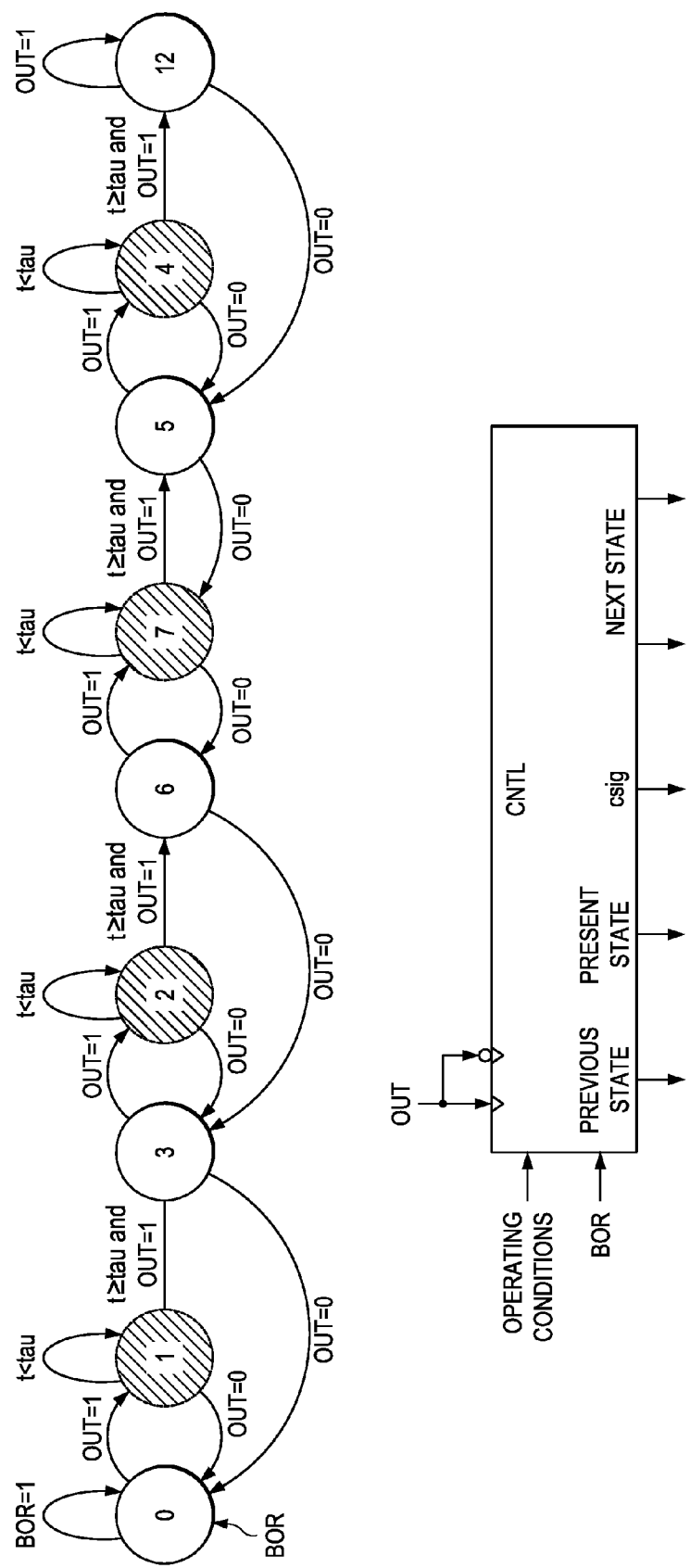
FIG. 3 is a first example of a state diagram of the embodiment shown in FIG. 2.

FIG. 3 illustrates switching of the reference voltages Vref1a, Vref1b, Vref2a and Vref2b. FIG. 3 is a state diagram of control stage CONTROL used to control the reference voltages Vref1a, Vref1b, Vref2a and Vref2b. After a voltage reset control stage CONTROL is reset to an initial state 0. Following this reset the supply voltage starts ramping up from its initial value of 0 V. The reference voltage is set to the lowest Vref2b following reset. The output signal OUT is at logic 0 when the supply voltage Vcc is less than the first reference voltage Vref2b. Output signal OUT goes high to logic 1 when Vcc becomes greater than Vref2b. Output signal OUT from comparator COMP is always logic 0 if the supply voltage Vcc is lower than the selected reference voltage to which it is being compared. If OUT=1 the internal state of the control stage changes from state 0 to state 1. State 1 is only a temporary state. Control stage CONTROL leaves state 1 upon expiration of a time tau that chosen in accordance with the comparator's settling time or if OUT=0. A transition from state 1 to state 3 occurs, if t≧tau AND OUT=1. This occurs when the supply voltages remains above Vref2b, time tau has expired and thus comparator COMP has settled. OUT=1 means that the voltage remains above the first reference voltage Vref2b. When control stage CONTROL enters state 3 it sends a control signal csig to the control input CNTL_IN of comparator COMP that switches off the lowest first reference voltage Vref2b and switches on the second and next highest reference voltage Vref2a. A similar action occurs when the supply voltage Vcc becomes greater than Vref2a. Output signal OUT goes high and control stage CONTROL is latched into the next transitional state 2. After the time tau, control stage CONTROL enters state 6 and outputs control signal csig to control input CNTL of comparator COMP. This switches on the next reference voltage Vref1b. When the supply voltage increases the procedure is the same passing from state 6 through state 7 to state 5 and passing from state 5 through state 4 to state 12. If the supply voltage falls, then the process reverses as the supply voltage Vcc ramps back down. When the supply voltage is higher or lower than the reference, then the output of comparator COMP latches control stage CONTROL to enter the next higher or next lower state. This then controls comparator COMP to switch to the input path associated with the next highest or next lowest reference voltage thereby selecting a different reference voltage. The output signal OUT from comparator COMP is used to control stage CONTROL if the rise time of the supply voltage Vcc is not too high. The time tau is used as a debouncing period. This is the time needed for comparator COMP to settle after it switches to another reference voltage.

FIG. 3 illustrates control stage CONTROL below the state diagram. Control stage CONTROL receives the comparator's output signal OUT, operating conditions, the power on reset signal BOR and may depending on the specific implementation receive indicators of present, previous and the next state of control stage CONTROL. The next or previous state relates to the states which are available in the present state. The state signals preferably provide the required reference voltages necessary for the next state. Generally, the state indicators of the next, previous, and/or present states can be used to configure other stages, parts or components of the electronic device.

Figure 4:
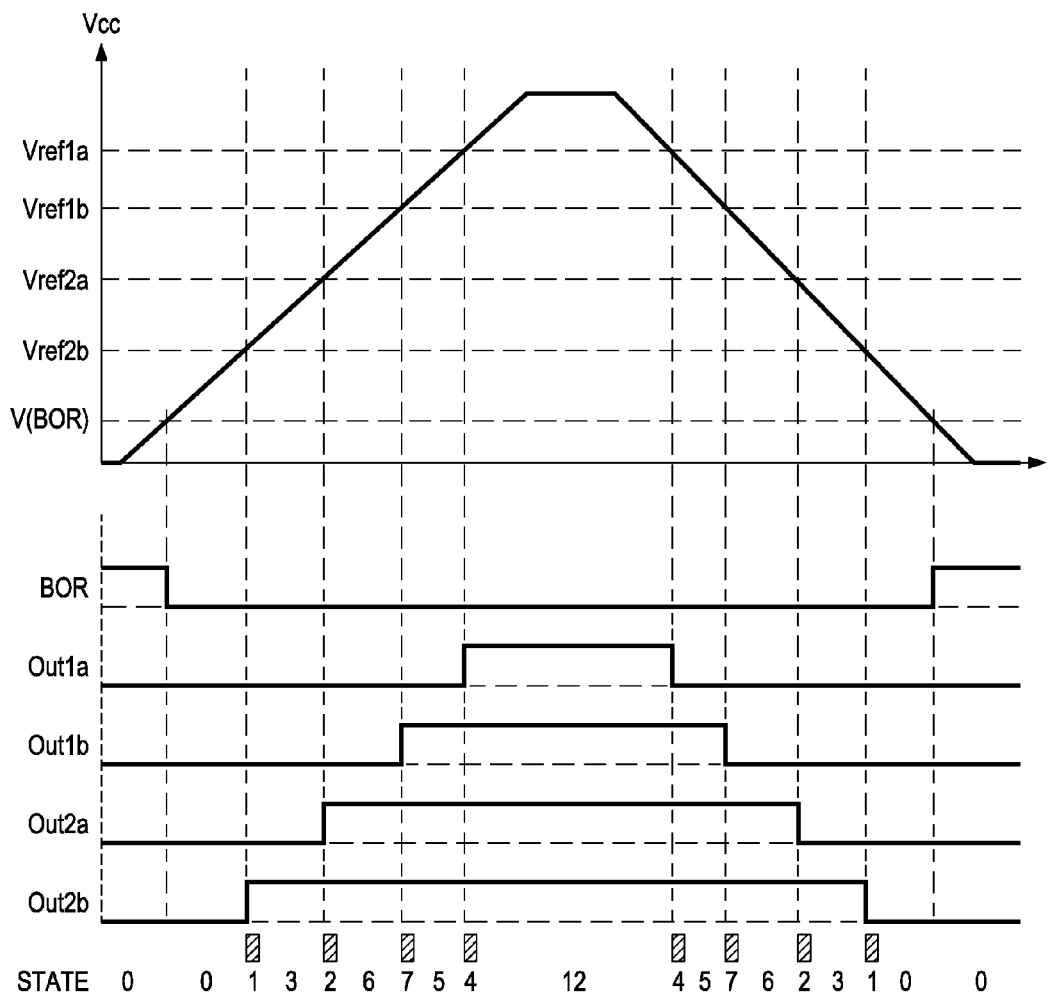
FIG. 4 is a graph of constantly increasing and decreasing supply voltage as a function of time showing reference voltages, output states and states of the state machine of a comparator according to the embodiment shown in FIG. 3.

As already explained with respect to FIG. 2, the input signals of comparator COMP are switched in response to a supply voltage Vcc that is rising and falling as shown in the upper part of FIG. 4. In addition to signals illustrated in FIG. 2, FIG. 4 shows the internal states of a state machine as shown in FIG. 3. Each rising or falling edge of the output signals Out1a, Out1b, Out 2a and Out2b represents a change of the logic of the output OUT of comparator COMP which would occur in response to a transition of the supply voltage Vcc across a reference voltage Vref1a, Vref1b, Vref2a or Vref2b, if only the respective reference voltage Vref1a, Vref1b, Vref2a or Vref2b were applied to the input of the comparator. In the present invention, a change of the supply voltage can cause a change of the comparator COMP output signal OUT. This thereby causes a change of the internal states 0 to 7 and 12 of control stage CONTROL. The lower part of FIG. 4 illustrates the states along the time axis. The changes between the states are in accordance with the state diagram of FIG. 3. After the power on reset signal BOR goes low indicating the supply voltage is just high enough for proper operation, the supply voltage Vcc ramps up. When the supply voltage exceeds Vref2b, the internal state changes from 0 to 1. However, state 1 is only a transitional state, which is maintained just long enough to let comparator COMP properly settle. After a period of time tau that is determined by the settling time of comparator COMP, the internal state of control stage CONTROL changes to state 3. The further changes are similar to the procedure explained above with respect to FIG. 3.

Figure 5:
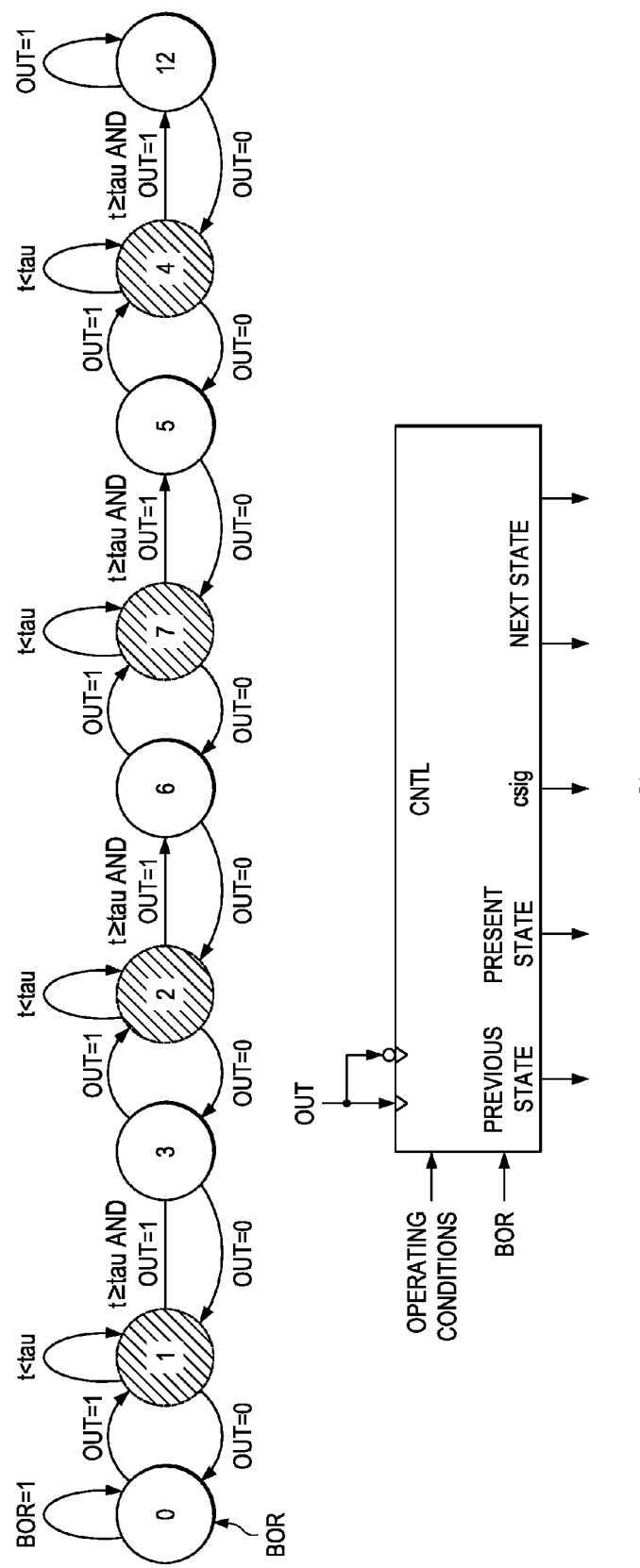
FIG. 5 is a second example of a state diagram and a corresponding block diagram of a device according to the present invention.

FIG. 5 shows a state diagram and a corresponding block diagram of another embodiment of the present invention. The state diagram represents another configuration of control stage CONTROL. The transitions are different from the configuration shown in FIG. 3 with respect to a falling supply voltage Vcc. According to the state diagram, from states 12, 5, 6, and 3 the state machine proceeds to respective transitional states 4, 7, 2, and 1 rather than to states 5, 6, 3 and 0 as shown in FIG. 3. This aspect of the invention provides an additional debouncing capability for falling supply voltages. The debouncing period is helpful if comparator COMP can not immediately provide a stable output signal.

Figure 6:
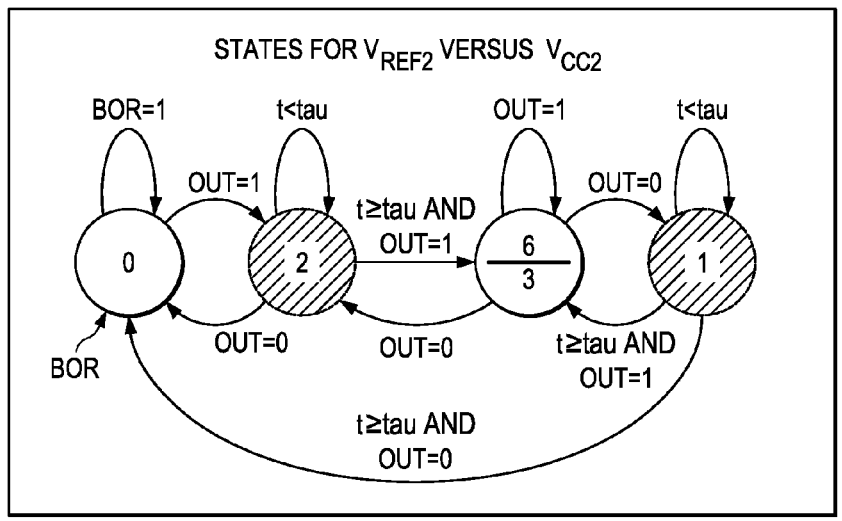
FIG. 6 is a third example of a state diagram and a corresponding block diagram of a device according to the present invention.
Figure 6:
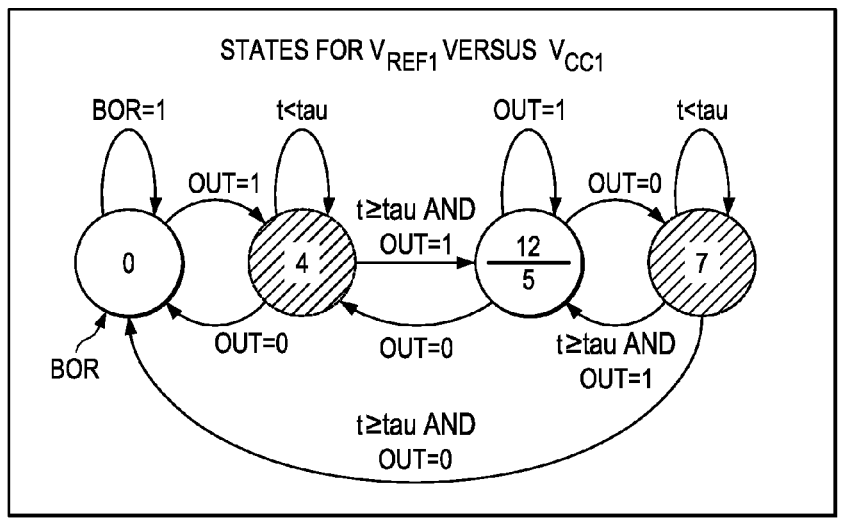
Figure 6:
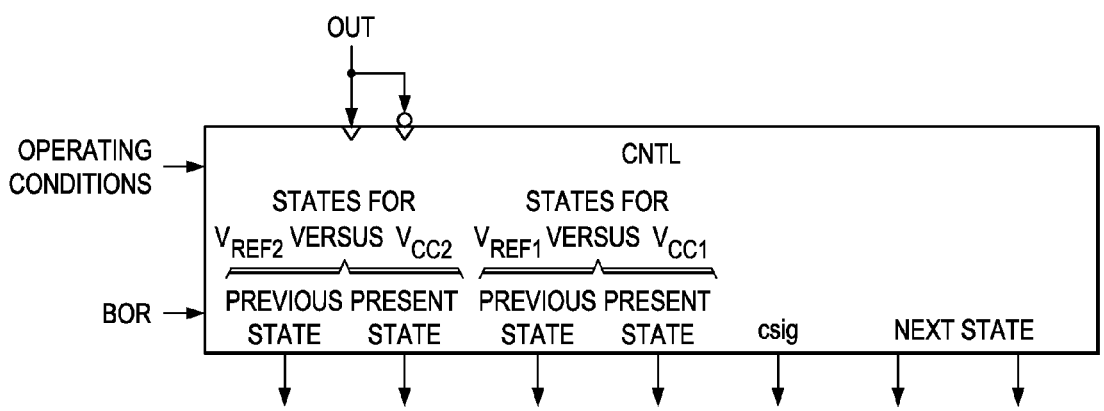

FIG. 6 shows an embodiment in which the state machine is functionally divided into a stage for a first reference voltage Vref1 and a stage for a second reference voltage Vref2. The state diagram relates to a multi-input comparator configuration to monitor multiple input signals. The two functional stages may be implemented in a single state machine or as two physically independent state machines. This provides a higher degree of freedom for monitoring two or more different supply voltages and for reacting to their changes independently. The supply voltage Vcc1 is compared with reference voltage Vref1 and Vcc2 is compared with the reference voltage Vref2 separately and individually. The upper stage illustrated in FIG. 6 monitors Vcc2 and the lower stage monitors Vcc1. Due to the split configuration, the wait time tau should be defined so that a change between the two state machines or state machine stages is possible. When the comparator output signal OUT is evaluated either one of the state machine stages can be activated and the other stage deactivated. This allows independent reactions to the reference voltages applied to the comparator inputs. Furthermore, hysteresis can be set independently with greater freedom. The split circles for states 6 and 3 and 12 and 5 indicate differing transition paths. The state machine enters state 6 only during a transition from state 2 to state 1. The state machine enters state 3 only transitioning from state 1 to 2. The same principle applies to states 12 and 5. The state machine enters state 12 only when leaving state 4. The state machine enters state 5 only when leaving state 7. The condition to transition from state 2 to state 6, and from state 1 back to state 3 is illustrated as *) and is defined as t≧tau AND OUT=1. This means that the settling time tau for the comparator output OUT or other components involved in the settling of the circuitry must have expired and the comparator output OUT must be a logical high or 1. The condition for passing from state 1 or state 7 to state 0 is illustrated as **) and is defined as t≧tau AND OUT=0. In the lower state machine stage, the illustrated condition *) is defined as t≧tau AND OUT=1. This condition is required for transitions from state 4 to state 12 and from state 7 to state 5. The block diagram in FIG. 6 takes account of the split configuration by providing the indicators of proceeding and subsequent states. Thus there is a pair of these signals for each stage. The operating conditions can be used for configuring the stages.

Figure 7:
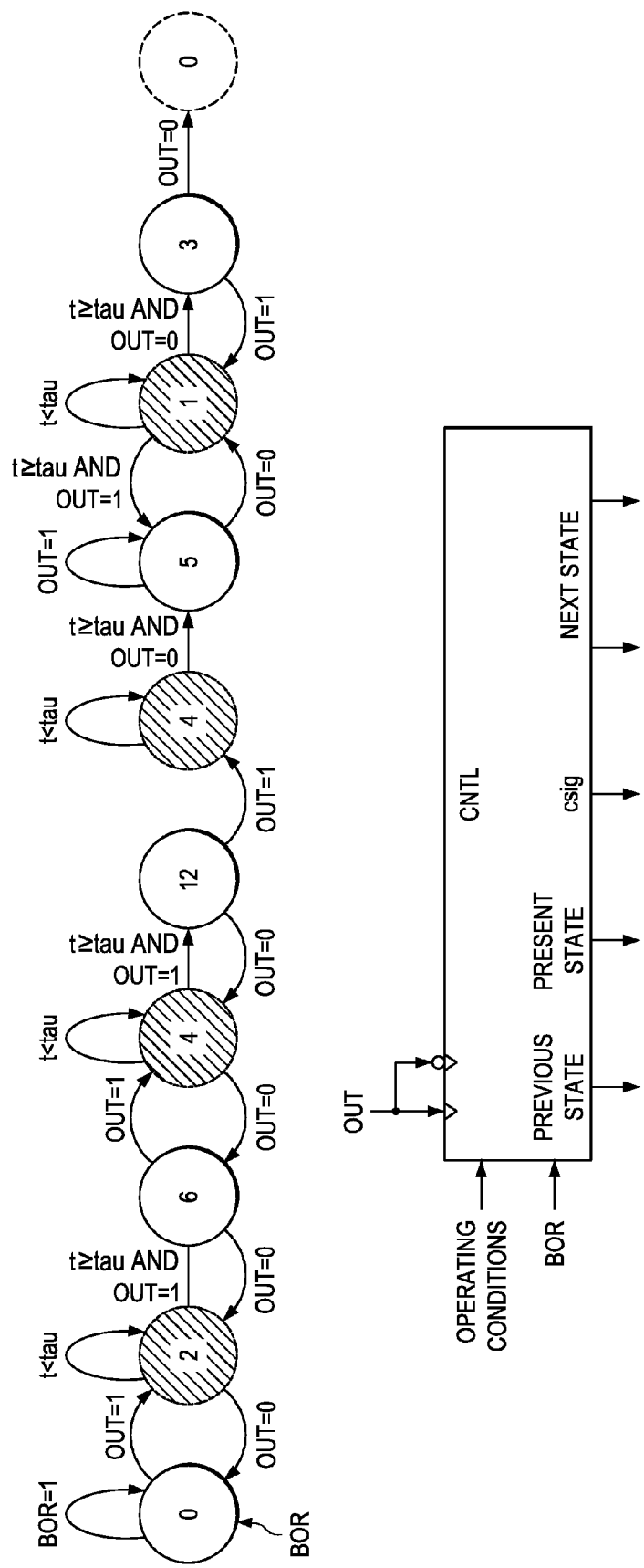
FIG. 7 is a fourth example of a state diagram and a corresponding block diagram of a device according to the present invention.

FIG. 7 shows a state diagram relating to another embodiment of the present invention. The states are now arranged in a closed loop where the way back from state 12 to state 0 goes through states 4, 5, 1, and 3. The way up from state 0 to state 12 goes through states 2, 6 and 4. The configuration may be selected by the operating condition signals shown at the block diagram of the corresponding control stage CONTROL below the state diagram.

Figure 8:
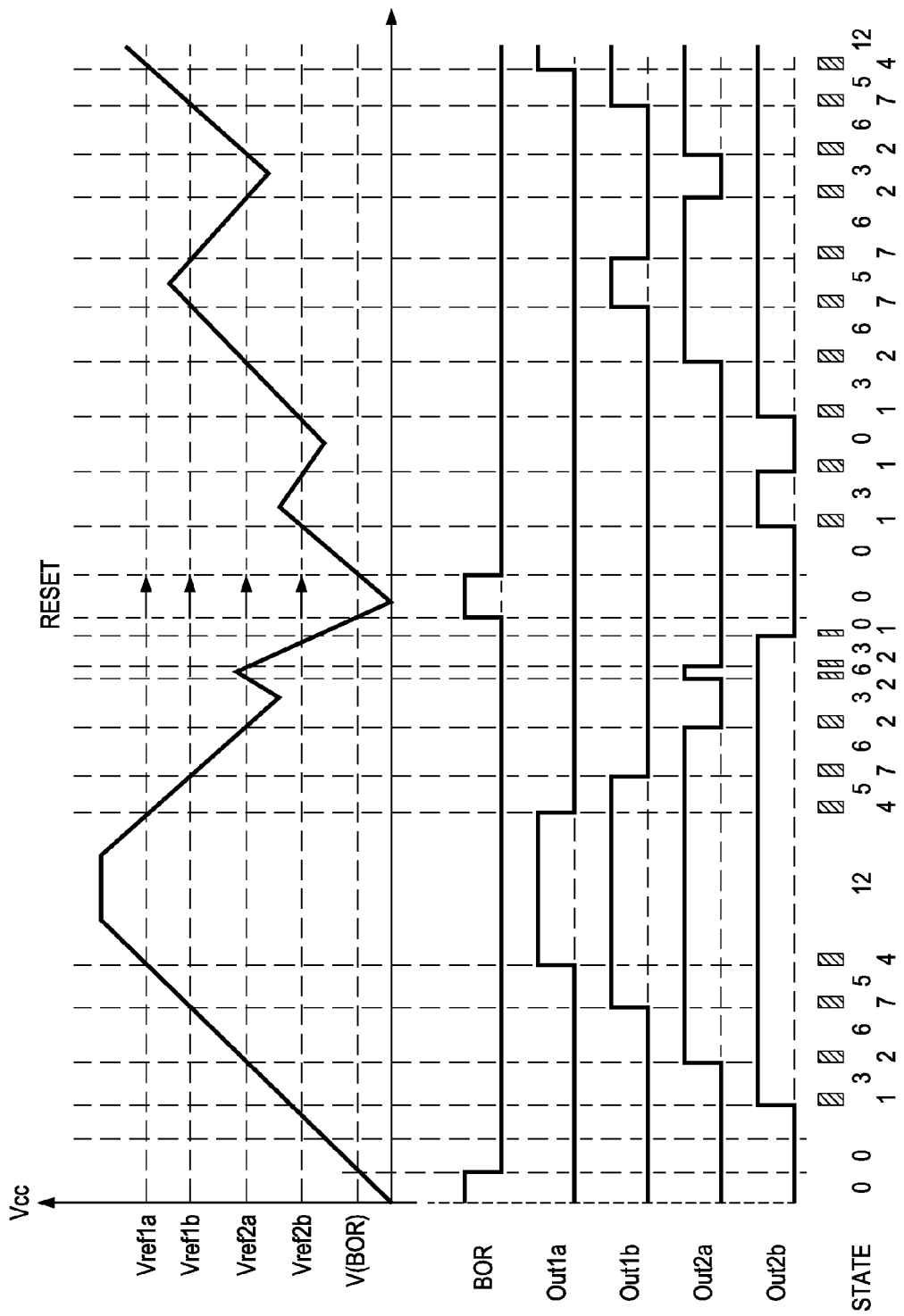
FIG. 8 is a graph of irregularly increasing and decreasing supply voltage as a function of time showing reference voltages and output states of an embodiment according to the present invention.

FIG. 8 shows a graph of: an irregularly increasing and decreasing supply voltage Vcc as a function of time; reference voltages Vref1a, Vref1b, Vref2a and Vref2b; the corresponding output signal OUT in terms of Out1a, Out1b, Out 2a and Out2b referring to the respective reference voltages; and the states in FIG. 7. As with the first embodiment, control stage CONTROL controls comparator COMP to switch between the input paths associated with the four different reference voltages Vref1a, Vref1b, Vref2a and Vref2b. After powering up the device, the power on reset signal BOR goes low. Comparator COMP and control stage CONTROL start working. Control stage CONTROL start at its initial state 0. Control stage CONTROL controls comparator COMP to start with the lowest voltage after reset. This compares supply voltage Vcc with the lowest reference voltage Vref2b. If supply voltage Vcc is higher than the reference voltage Vref2b, then control stage CONTROL enters state 3 through transitional state 1. This state is latched and available for the control software in control stage CONTROL. The state can be latched with the output signal from output OUT of comparator COMP if the rise time of supply voltage Vcc is not too fast. A time tau is used as a wait time until output OUT of comparator COMP has settled after changing the reference voltage. This settling time is implemented by transitional state 1. Following the rising and falling ramps of supply voltage Vcc control stage CONTROL propagates through states 1, 3, 2, 6, 7, 5, 4 and 12 and from 12 back to state 3 via states 4, 5, 7, 6 and 2. However on entering state 3, supply voltage Vcc starts rising again. Therefore, the next state after state 3 is transitional state 2. From state 2, the next state is state 6 since the supply voltage exceeds the reference voltage Vref2a. Thereafter, the voltage falls again and enters states 6 2, 3 and 1. Then a reset pulse BOR is generated due to the low supply voltage Vcc. The state machine enters state 0. Once supply voltage Vcc has reached again a sufficiently high voltage and in accordance with the further behavior of supply voltage Vcc the states are traversed as indicated in the bottom of FIG. 8. The behavior shown in FIG. 8 can be the scenario during a battery change of an electronic device using a comparator of the present invention.

Figure 9:
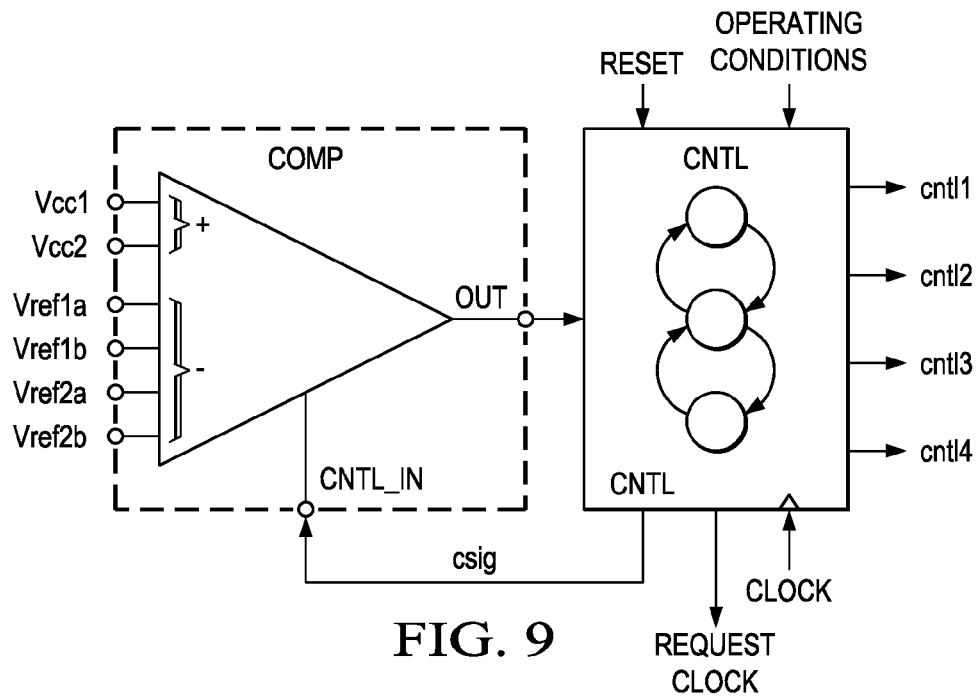
FIG. 9 is a simplified schematic of an embodiment according to the present invention.

FIG. 9 shows a comparator according to the invention which can be used for observing more complex voltage conditions where the voltage increases and decreases irregularly such as those shown in FIG. 8. Comparator COMP is implemented similar to the first embodiment shown in FIG. 1. Control stage CONTROL, although coupled to the comparator COMP in the same way as in the first embodiment, has an additional clock input CLK and a request clock output REQ_CLK. The use of the clock signal CLK and request clock signal at output REQ_CLK will be explained from the description of FIGS. 10 to 13.

Figure 10:
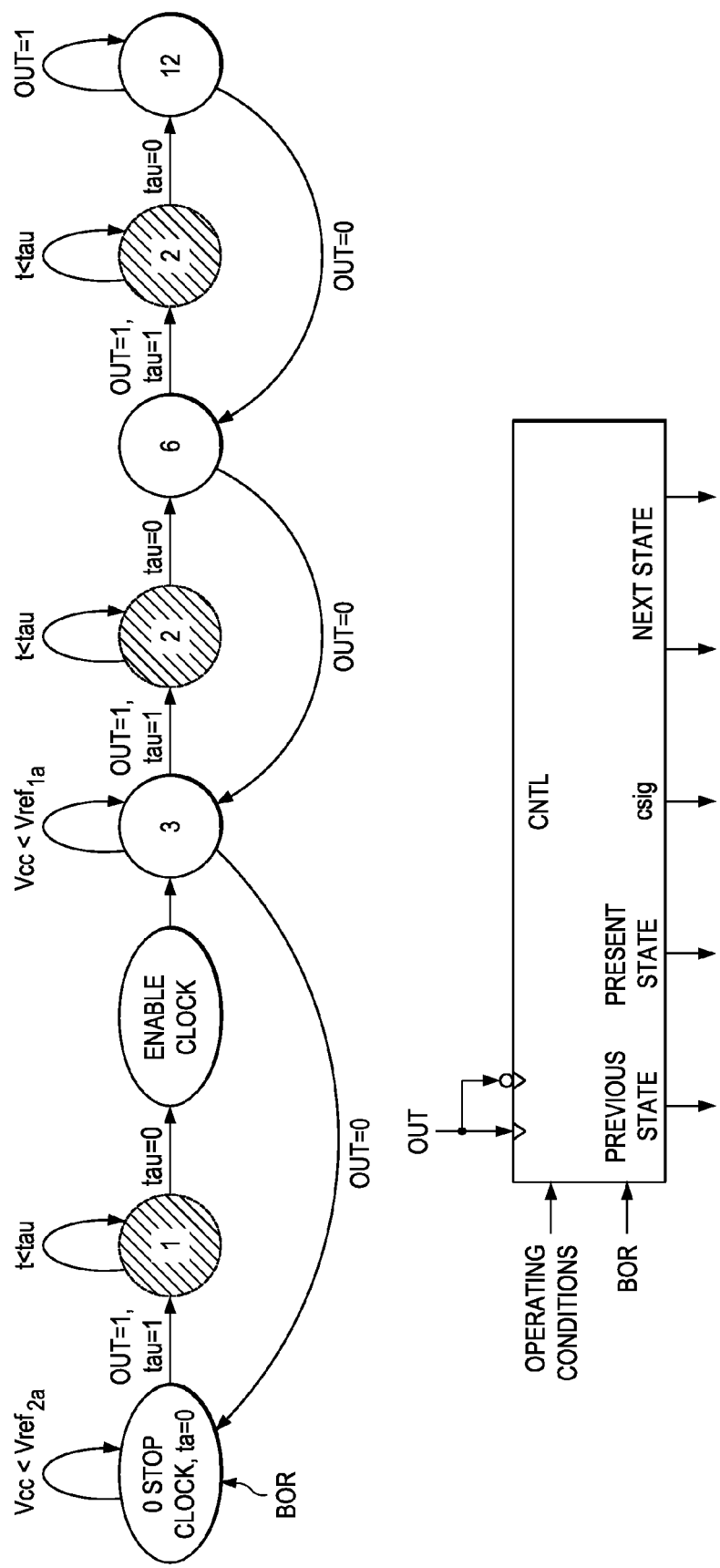
FIG. 10 is a fifth example of a state diagram and a corresponding block diagram of a device according to the present invention.

The state diagram shown in FIG. 10 is an embodiment of the present invention where control stage CONTROL has a fast path to the highest state 12 associated with the uppermost reference voltage Vref1a and also has a fast path to return to lower references when the supply voltage Vcc drops. After the next state is latched in control stage CONTROL, a wait time tau is introduced allowing output OUT of comparator COMP to settle before the control signal is fed to control input CNTL_IN controlling comparator COMP to switch to the next reference voltage. This wait time tau is used only when a supply voltage Vcc is greater than the lowest reference voltage Vref2a. Instead of Vref2a, it is equally possible that Vref2b is applied. The operating condition signals indicate the reference voltage selected for comparison. Following reset and the time tau the clock is enabled. The state machine will leave State 3 only if supply voltage Vcc is greater than Vref1a. The condition indicated in FIG. 10 by *) determines that the state machine will leave state 3 only if the comparator output OUT=1 and the wait time tau=1. This means that the wait time until comparator output OUT has settled has expired. Compared with the previous embodiments, the present embodiment shown in FIG. 10 provides that a transition from one state to another is not only a function of the state of comparator output OUT, but that it is additionally controlled and timed by use of a timing function such as a clock signal. This ensures that a predetermined minimum settling time tau for the comparator or other components has expired before the change of states can occur.

Figure 11:
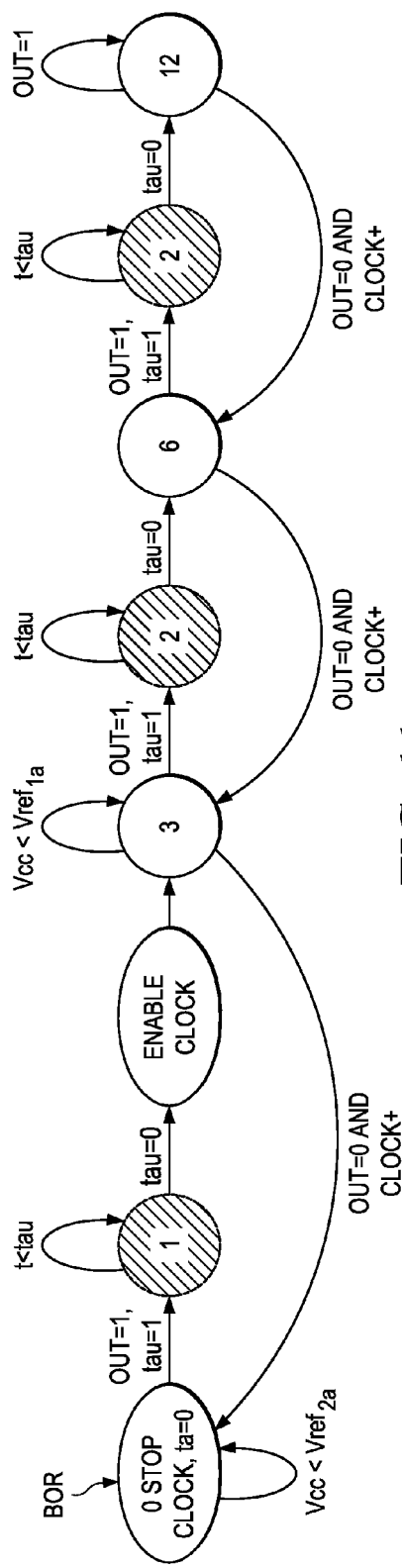
FIG. 11 is a sixth example of a state diagram of a device according to the present invention.

FIG. 11 shows a state diagram relating to another embodiment of the present invention. The state diagram shown in FIG. 11 has a fast path to the highest input reference Vref1a. The path to return to lower references can be fast as well. The embodiment shown in FIG. 10 changes from one state to another based on the wait time tau for settling the output signal OUT. The embodiment shown in FIG. 11 introduces a clock signal CLK to slow down the state changes from one state to the other. The condition for proceeding from one state to the next higher state is OUT=1 and tau=0 indicating the settling time has expired. The condition to fall back from a higher state such as from state 3 to state 0 is OUT=0 AND CLOCK+. This requires an edge or transition of a clock signal to reach the next state.

Figure 12:
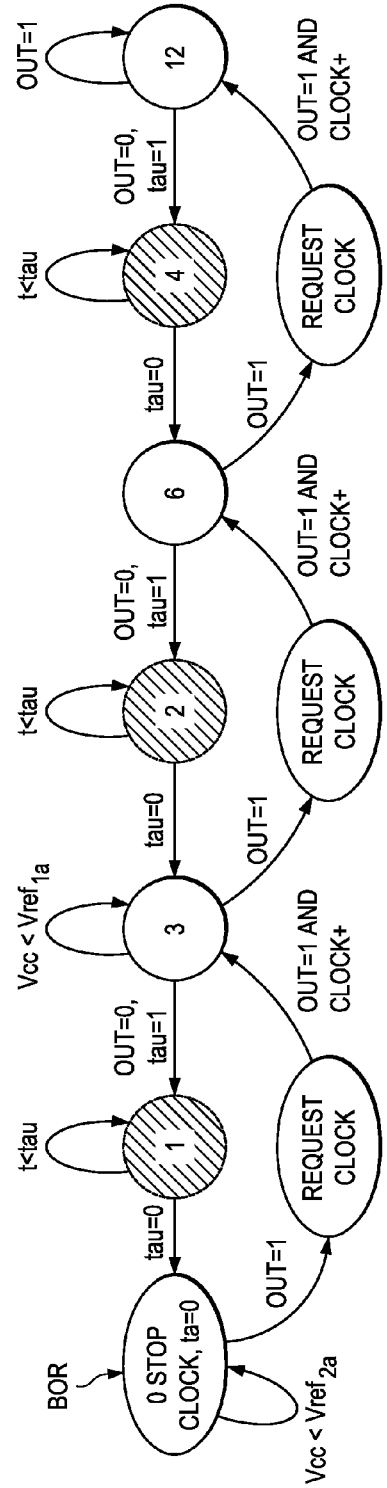
FIG. 12 is a seventh example of a state diagram of a device according to the present invention.

FIG. 12 is similar to the embodiment shown in FIG. 11. However, the path from a lower state to a higher state and the path from a higher state to a lower state are exchanged. If the comparator output signal OUT=1, a clock signal is required before the system can proceed to the next state. This is indicated by the state Request Clock illustrated in FIG. 12. The path from a higher state to a lower state is limited by the comparator's settling time tau. The path to return to an upper reference requires that comparator output OUT is high and the clock signal is present. This requires an edge or transition of the clock and is indicated by CLOCK+. However, the clock signal is only received in response to a clock request. In the previous examples, slowing down the changes from one state to another using a clock is useful for reducing the power consumption. Furthermore, compared with the embodiments shown in FIGS. 10 and 11, the clock can be stopped or slowed down as long as it is not requested. After a request, the clock may run for only a specific number of clock cycles and then be switched off to save as much power as possible.

Figure 13:
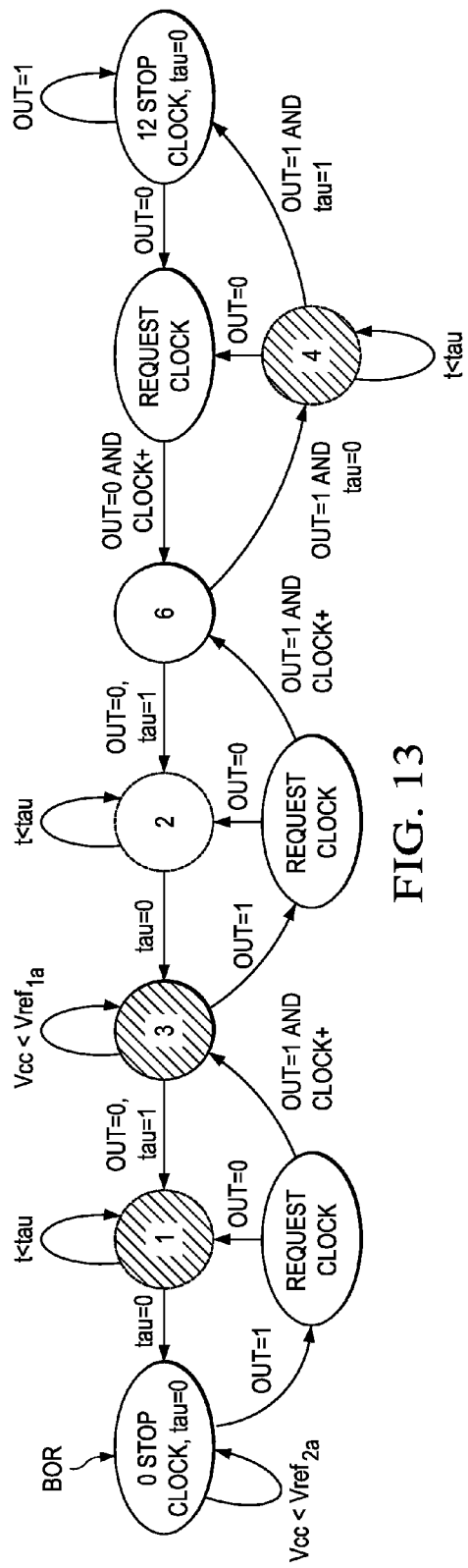
FIG. 13 is an eighth example of a state diagram of a device according to the present invention.

FIG. 13 shows a state diagram of another embodiment of the present invention. After reset (BOR), the clock is stopped. The state machine waits until Vcc ≧Vref2a. As previously mentioned, any reference can be applied instead of Vref2a depending on the operating conditions. If Vcc ≧Vref2a, then comparator output OUT=1. Upon a positive clock edge (CLOCK+) the system proceeds to state 3. The state diagram shown in FIG. 13 provides fast and slow path from one stage to another. The fast paths are used to support the most important conditions, which are to be detected as soon as possible. A fast down-path from a higher state to a lower state is advantageous for detecting undervoltage conditions. A fast up-path is advantageous for detecting over-voltage conditions. If the system speed is not critical, both paths can be slowed down by additional delay in the up or the down direction by further clock requests.

Figure 14:
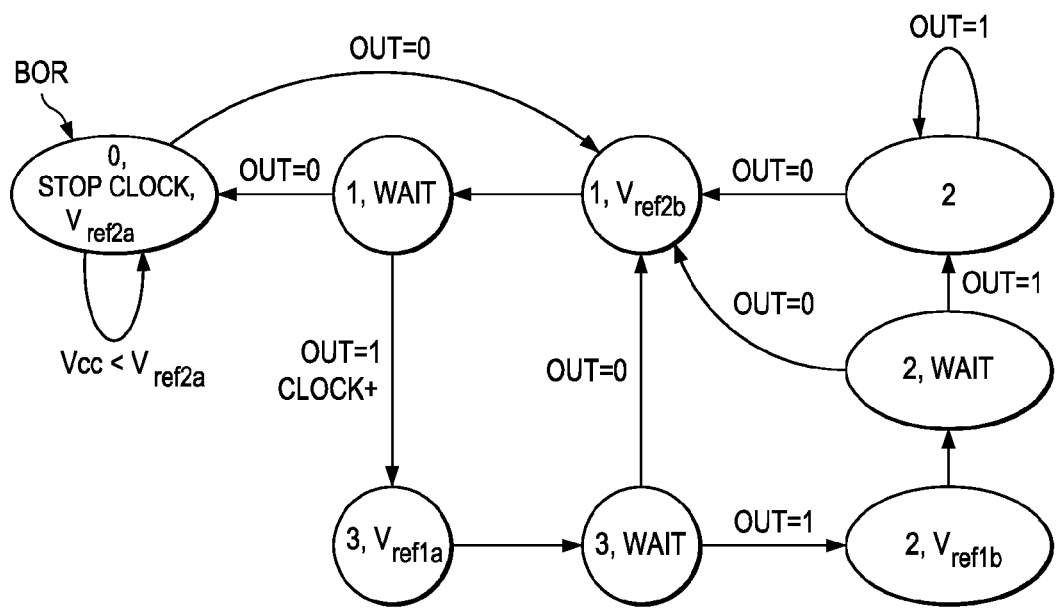
FIG. 14 is a ninth example of a state diagram of a device according to the present invention.

FIG. 14 shows a state diagram of a comparator with hysteresis on switching between states. Table 1 shows the corresponding logic states. The first 0 in the State column is merely required to make the specific bit changes. The states in FIG. 14 are indicated in decimal numbers and correspond to the binary numbers in Table 1 where 000=0, 001=1, 010=2, 011=3, etc. The actual state and corresponding logic at the output OUT of comparator COMP are used to control the reference voltages and the digital flag. The flags can then be used by control software in control stage CONTROL to control comparator COMP to switch between reference voltages.

TABLE 1

| State Present State | OUT | Next State | Comment |
|---|---|---|---|
| 000 | 0 | (000) | After reset or Vcc < Vref2a |
| 000 | 1 | 001 | Vcc ≧ Vref2a; apply Vref2b; wait |
| 001 | 0 | 000 | Vcc < Vref2b; apply Vref2a; wait |
| 001 | 1 | 011 | Vcc ≧ Vref2b; apply Vref1a; wait |
| 011 | 0 | 001 | Vcc < Vref1a; apply Vref2b; wait |
| 011 | 1 | 010 | Vcc ≧ Vref1a; apply Vref1b; wait |
| 010 | 0 | 001 | Vcc < Vref1a; apply Vref2b; wait |
| 010 | 1 | 010 | Vcc ≧ Vref1b |

The relationship between the reference voltages is as shown in FIG. 2 where Vref2b<Vref2a<Vref1b<Vref1a. The hysteresis is established where transition to the next state is only performed if the supply voltage exceeds the higher reference. The control stage can return to the previous state, only if the reference falls below the lower reference voltage.

The sequence of changing states of control stage CONTROL for proper operation of the device is 000 to 001 to 011 to 010 for an increasing supply voltage Vcc increases and 010 to 001 to 000 for a decreasing supply voltage Vcc.

Figure 15:
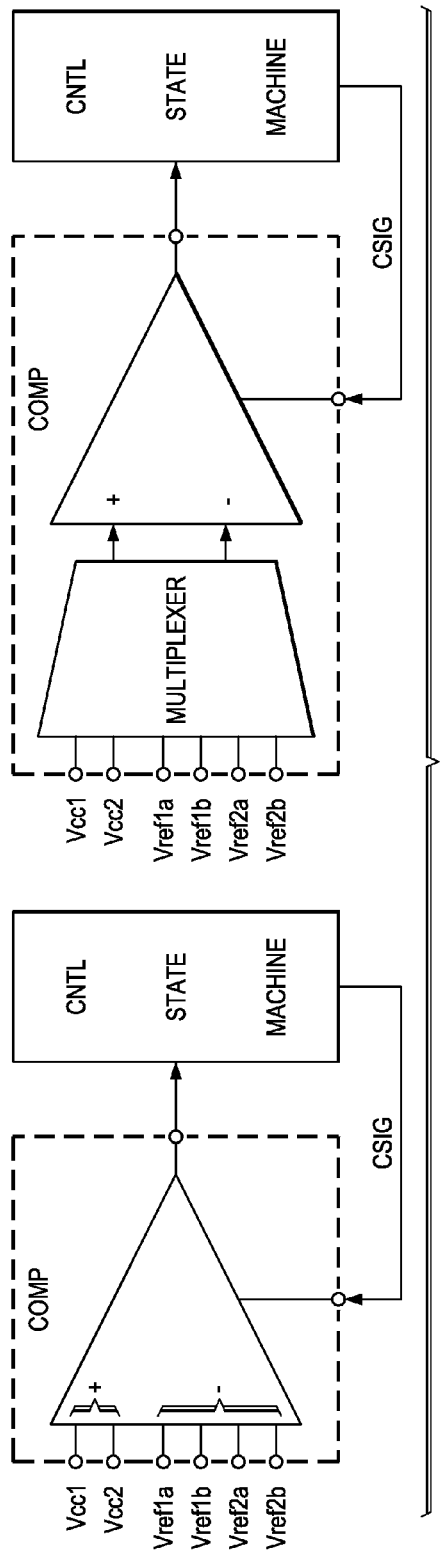
FIG. 15 is a simplified circuit diagram of a two embodiments according to the present invention.

FIG. 15 shows two simplified block diagrams of embodiments of the present invention. The input paths for the multiple reference voltages Vref1a, Vref1b, Vref2a and Vref2b and supply voltages Vcc1 and Vcc2 can be provided either at the inputs of comparator COMP (left portion of FIG. 15) or at the inputs of digital multiplexer MUX (right portion of FIG. 15). The output signals csig of control stage CONTROL are fed to a control input CNTL_IN of multiplexer MUX. This controls multiplexer MUX so that it switches one of the reference voltages Vref1a, Vref1b, Vref2a and Vref2b to the negative input of comparator COMP. Multiplexer MUX also provides a selected supply voltage to the positive input of comparator COMP. The multiplexing can also be performed within comparator COMP. In this embodiment comparator COMP receives control signals csig from control state machine CNTL–.

Figure 16:
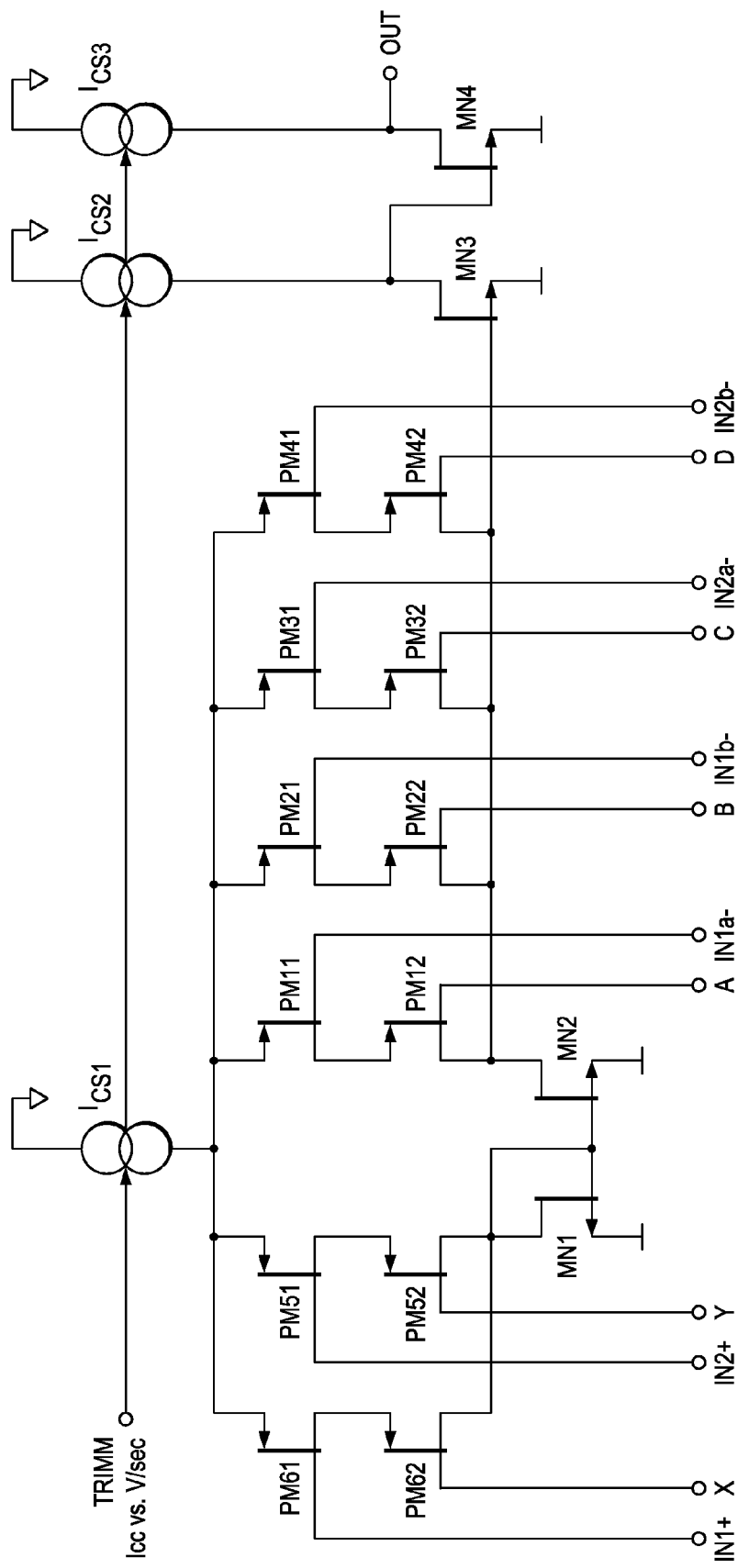
FIG. 16 is a simplified schematic of a comparator according to the present invention.

FIG. 16 shows a circuit diagram of comparator COMP according to the present invention. Differential pairs of MOS transistors are used for inputting the supply voltages Vcc1 and Vcc2, and the reference voltages Vref1a, Vref1b, Vref2a and Vref2b. Each input voltage controlled with a corresponding a voltage select signal X, Y, A, B, C and D. The sequence of the differential pairs of transistors can also be changed in order to change the operating conditions and corresponding accuracy of comparator COMP. Comparator COMP has multiple input paths, each consisting of a pair of MOS transistors. Only a single input path per input stage per side of the differential pair MN1 and MN2 is switched on. For the first input stage there are pairs: PM11 and PM12; PM21 and PM22; PM31 and PM32; and PM41 and PM42. For the second input stage there are pairs: PM51 and PM52; and PM61 and PM62. There is a single NMOS transistor for each input stage that is shared by all input paths. Transistors PMX1 (where X serves as wildcard for the respective path number) receives the respective reference voltage (those MOS pairs on the right hand side) or supply voltage (those MOS pairs on the left hand side). Transistors PMX2 serve to switch the respective input path X on and off. MN3 and MN4 form an output stage providing the comparator output signal OUT. Current sources ICS1, ICS2, ICS3 are variable. They may be a current mirror configuration. The more current these current sources supply to the respective input path and to the output stage the quicker the comparator can switch and settle. The comparator can be configured by adjusting the current through input TRIMM. The term Icc vs. V/sec indicates that the current Icc supplied by the current sources is variable and that the slew rate V/sec of the comparator increases with an increasing supply current Icc.

Figure 17:
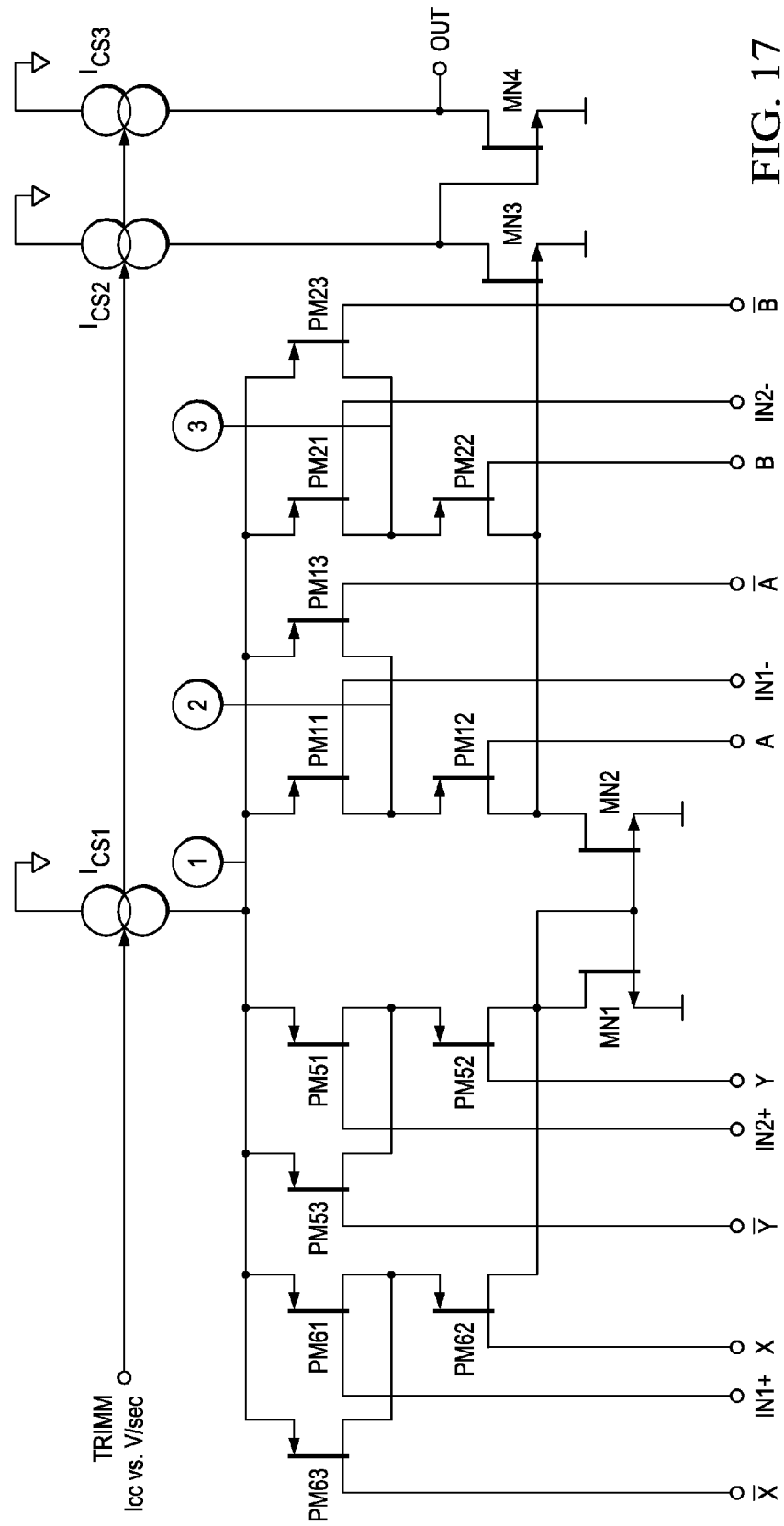
FIG. 17 is a simplified schematic of a comparator according to the present invention.

FIG. 17 shows a circuit diagram of an improved configuration of comparator COMP according to a preferred embodiment of the invention. The comparator illustrated in FIG. 17 has four input paths, two per each input stage on either side of the differential pair MN1 and MN2. The number of input paths is not restricted to the illustrated configuration. This embodiment includes additional single MOS transistors PM13, PM23, PM53 and PM63. One such MOS transistor PM13, PM23, PM53 and PM63 is associated with each input path of the differential pair. The gates of the single MOS transistors PM13, PM23, PM53, PM63 receive a respective inverse select signal $\overline{X}$, $\overline{Y}$, $\overline{A}$ and $\overline{B}$ that are the inverse of the corresponding select signal X, Y, A and B applied to the corresponding switching transistor PM12 to PM62. The drain terminals of the single MOS transistors PM13 to PM63 are coupled to a respective interconnection of the corresponding pairs PM11/PM12 to PM61/PM62. This embodiment improves the speed of comparator COMP, since the reference voltage or supply voltage currently switched on can be permanently applied to the transistors that are currently switched off. For example, if input IN1− is coupled to Vref1a and input IN2− is coupled to Vref2a and the select signal A is logic high (A=1), then the select signal B is low (B=0). However, the inverted select signals $\overline{A}$ is low ($\overline{A}$=0) and $\overline{B}$ is high ($\overline{B}$=1). Therefore, PM13 is conductive. Input path 1 including PM11, PM12 and PM13 is switched off, but the node 2 is coupled to 1 through PM13 and preloaded with the voltage at node 1. The same situation occurs at node 3 if B=1. The voltage at node 3 already has the same voltage as node 1 if the reference voltage is to be changed from Vref1a to Vref2a, and vice versa. For B=1 and A=0, the voltage at node 2 already has the same as that at node 1 if the reference voltage changes from Vref2a to Vref1a. Advantageously, the switching from A=0 and $\overline{A}$=1 to A=1 and $\overline{A}$=0 is performed in a non-overlapping manner to prevent changing the pre-loaded signal at node 2.

Figure 18:
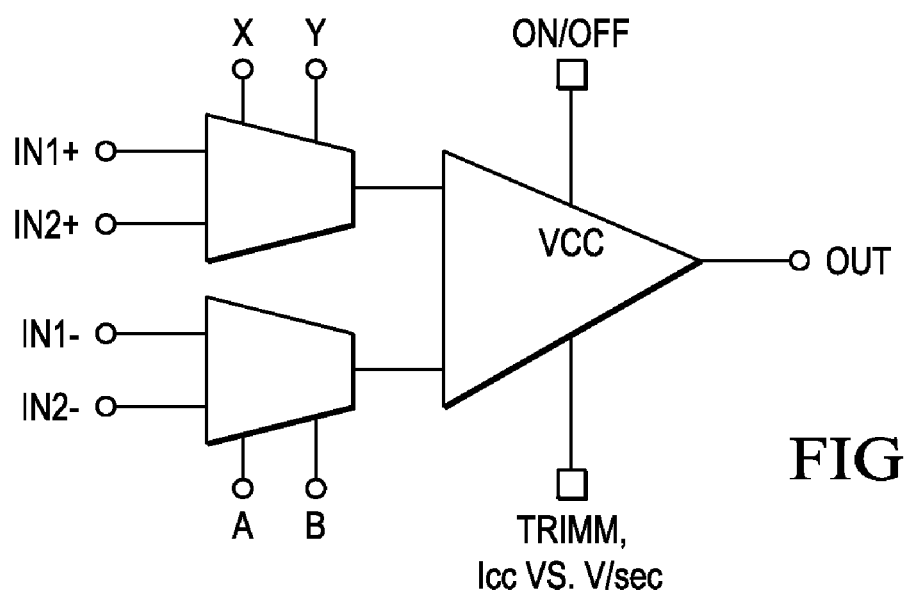
FIG. 18 is a simplified schematic of a comparator according to the present invention.

FIG. 18 shows a simplified circuit diagram of an embodiment of the present invention. Two analog multiplexers MUX1 and MUX2 are coupled to the respective positive and negative inputs of comparator COMP. Multiplexer MUX1 has two inputs receiving supply voltages Vcc1 and Vcc2. Multiplexer MUX2 has two inputs for receiving reference voltages Vref1 and Vref2. Multiplexer MX1 receives two control inputs X and Y. Multiplexer MX2 receives two control inputs A and B. As in the previous embodiments, comparator COMP has an output OUT. Comparator COMP is slightly differently configured, with an enablement input On/Off connected to the supply voltage and an input Trimm for adapting switching speed and settling behavior. Switching between the reference voltages Vref1 and Vref2 is performed in this embodiment by select signals A and B to the multiplexer MUX2 so that the device of this embodiment has the same functionality as those of the previous embodiments. This embodiment provides the advantage of being very simple to implement, because a single stage comparator can be used while multiple reference voltages can be provided with individual paths that can be switched on and off.

Although the present invention has been described hereinabove with reference to specific embodiments, it is not limited to these embodiments and no doubt further alternatives will occur to the skilled person that lie within the scope of the invention as claimed. In particular, although the embodiments of the present invention primarily relate to supply voltages and supply voltages, the present invention is not limited to monitoring supply voltages. The voltages applied to the comparator can be voltages which are derived from other voltages than supply voltages.

What is claimed is:

1. An electronic device for comparing a first voltage with a first reference voltage and a second reference voltage higher than the first reference voltage, the electronic device comprising:
   a comparator having a first input receiving the first voltage, a second input receiving a selected reference voltage one of the first reference voltage and the second reference voltage and an output providing an output signal based on a comparison of the first input and the second input;
   a control stage having an input connected to the output of the comparator generating a control signal based on the output signal from the comparator;
   wherein the control stage controls the comparator to apply either the first reference voltage or the second reference voltage as the selected reference voltage to the comparator in response to the control signal to compare the first voltage with the selected reference voltage; and
   wherein the control stage switches the selected reference voltage from the first reference voltage to the second reference voltage following reset if said comparator indicates said first voltage is greater than said first reference voltage for longer than a wait state, the wait state chosen corresponding to a settling time of the comparator.

2. The electronic device according to claim 1, wherein:
   the control stage performs a transition from the first reference voltage to the second reference voltage in response to a clock signal.

3. An electronic device for comparing a first voltage with a first reference voltage and a second reference voltage, the electronic device comprising:
   a comparator having a first input receiving the first voltage, a second input receiving a selected reference voltage one of the first reference voltage and the second reference voltage and an output providing an output signal based on a comparison of the first input and the second input, the comparator further selects one of the first voltage and a second voltage at the first input to be compared with the selected reference voltage, the first input of the comparator has an individual input path for each of the first voltage and the second voltage, each input path of an input stage is switched on and off individually for comparing the selected first input with the selected second input;
   a control stage having an input connected to the output of the comparator generating a control signal based on the output signal from the comparator;
   wherein the control stage controls the comparator to apply either the first reference voltage or the second reference voltage as the selected reference voltage to the comparator in response to the control signal to compare the first voltage with the selected reference voltage.

4. The electronic device according to claim 3, wherein:
   each input path remains in a preloaded state when being switched off.

5. The electronic device according to claim 1, wherein:
   the comparator has a trimming input to adjust settling behavior and power consumption.

6. An electronic device for comparing a first voltage with a first reference voltage and a second reference voltage, the electronic device comprising:
   a comparator having a first input receiving the first voltage, a second input receiving a selected reference voltage one of a plurality of more than two reference voltages having a sequence from lowest reference voltage to highest reference voltage and an output providing an output signal based on a comparison of the first input and the second input;
   a control stage having an input connected to the output of the comparator generating a control signal based on the output signal from the comparator, the control signal controlling the comparator to apply a selected one of the plurality of reference voltages to the comparator in response to the control signal to compare the first voltage with the selected reference voltage, and the control stage providing a wait state before switching the selected reference voltage from a reference voltage to a next higher reference voltage, the wait state chosen corresponding to a settling time of the comparator.

7. The electronic device of claim 6, wherein:
   the control stage provides the wait state before switching the selected reference voltage from a reference voltage to a next lower reference voltage.

8. The electronic device of claim 6, wherein:
   the control state further enables a clock upon switching the selected reference voltage from the lowest reference voltage to a second lowest reference voltage; and
   the control stage further waits until a next clock pulse before switching the selected reference voltage from a reference voltage to a next lower reference voltage.

* * * * *